United States Patent
Chiang et al.

(10) Patent No.: US 8,354,698 B2
(45) Date of Patent: Jan. 15, 2013

(54) VDMOS AND JFET INTEGRATED SEMICONDUCTOR DEVICE

(75) Inventors: Hsin-Chih Chiang, Hsinchu (TW); Han-Chung Tai, Kaohsiung (TW)

(73) Assignee: System General Corp., Taipei (TW)

( * ) Notice: Subject to any disclaimer, the term of this patent is extended or adjusted under 35 U.S.C. 154(b) by 267 days.

(21) Appl. No.: 12/828,366

(22) Filed: Jul. 1, 2010

(65) Prior Publication Data

US 2011/0180858 A1    Jul. 28, 2011

Related U.S. Application Data

(60) Provisional application No. 61/298,938, filed on Jan. 28, 2010.

(51) Int. Cl.
*H01L 29/80* (2006.01)

(52) U.S. Cl. ........ 257/262; 257/263; 257/287; 257/335; 257/504; 257/E21.421; 257/E27.059; 257/E29.257; 257/E29.265

(58) Field of Classification Search ................. 257/262, 257/263, 287, 335, 504, E21.421, E27.059, 257/E29.257, E29.265
See application file for complete search history.

(56) References Cited

U.S. PATENT DOCUMENTS

| | | | |
|---|---|---|---|
| 6,365,932 B1 * | 4/2002 | Kouno et al. | 257/341 |
| 6,815,794 B2 * | 11/2004 | Shin et al. | 257/500 |
| 6,867,476 B2 * | 3/2005 | Lee | 257/549 |
| 7,417,282 B2 * | 8/2008 | Jang et al. | 257/328 |

* cited by examiner

*Primary Examiner* — Andy Huynh
(74) *Attorney, Agent, or Firm* — McClure, Qualey & Rodack, LLP

(57) ABSTRACT

A semiconductor device. The semiconductor comprises a substrate, a VDMOS, a JFET, a first electrode, a second electrode, a third electrode and a fourth electrode. The VDMOS is formed in the substrate. The JFET is formed in the substrate. The first electrode, the second electrode and a third electrode are connected to the VDMOS and used as a first gate electrode, a first drain electrode and a first source electrode of the VDMOS respectively. The second electrode, the third electrode and the fourth electrode are connected to the JFET and used as a second drain electrode, a second gate electrode and a second source electrode of the JFET respectively.

14 Claims, 2 Drawing Sheets

VDMOS AND JFET INTEGRATED SEMICONDUCTOR DEVICE

This application claims the benefit of provisional application Ser. No. 61/298,938, filed Jan. 28, 2010, the subject matter of which is incorporated herein by reference.

BACKGROUND OF THE INVENTION

1. Field of the Invention

The invention relates in general to a semiconductor device, and more particularly to a semiconductor device having composite functions.

2. Description of the Related Art

Along with the advance in the development of semiconductor, a VDMOS (vertical diffused MOS) is provided. The VDMOS is a device used for amplifying or switching electronic signals. In the VDMOS, a voltage on an oxide-insulated gate can induce a conducting channel between the two other contacts called source and drain. The channel can be of n-type or p-type, and is accordingly called an n-VDMOS or a p-VDMOS. It is by far the most common transistor in both digital and analog circuits, though the bipolar junction transistor was at one time much more common.

However, if a driving voltage is only applied on the drain/source, the VDMOS cannot be worked on. The VDMOS must be applied driving voltage on both of the drain/source and the gate to be worked on. Therefore, the function of VDMOS is limited in its application.

SUMMARY OF THE INVENTION

The invention is directed to a semiconductor device, wherein a VDMOS and a JFET are integrated into a unitary structure such that the VDMOS can be self drove without applying any secondary voltage.

According to a first aspect of the present invention, a semiconductor device is provided. The semiconductor comprises a substrate, a VDMOS, a JFET, a first electrode, a second electrode, a third electrode and a fourth electrode. The VDMOS is formed in the substrate. The JFET is formed in the substrate. The first electrode, the second electrode and the third electrode are connected to the VDMOS and used as a first gate electrode, a first drain electrode and a first source electrode of the VDMOS respectively. The second electrode, the third electrode and the fourth electrode are connected to the JFET and used as a second drain electrode, a second gate electrode and a second source electrode of the JFET respectively.

According to a second aspect of the present invention, a semiconductor device is provided. The semiconductor device comprises a substrate, a first well, a second well, a third well, a first doping region, a second doping region, a third doping region, a fourth doping region, a polysilicon layer, a first electrode, a second electrode, a third electrode and a fourth electrode. The first well, the second well and the third well are located at a top side of the substrate and separated from each other, the first well located between the second well and the third well. The first doping region is formed in the substrate and located between the first well and the third well. The second doping region is formed in the first well. The third doping region is formed in the second well. The fourth doping region is formed in the substrate and located at a bottom side of the substrate. The polysilicon layer is formed above the substrate and located above a gap between the second doping region and the third doping region. The first electrode is electrically connected to the polysilicon layer. The second electrode is electrically connected to the fourth doping region. The third electrode is electrically connected to the third well. The second doping region and the third doping region and the fourth electrode are electrically connected to the first doping region. The doping type of the substrate, the first doping region, the second doping region, the third doping region, and the fourth doping are the same and complementary to that of the first well, the second well and the third well.

The invention will become apparent from the following detailed description of the preferred but non-limiting embodiments. The following description is made with reference to the accompanying drawings.

DETAILED DESCRIPTION OF THE INVENTION

A number of embodiments are disclosed below for more detailed description of the invention. However, the embodiments disclosed below are for exemplification only, not for limiting the scope of protection of the invention. Moreover, secondary elements are omitted in the embodiments disclosed below for highlighting the technical features of the invention.

Figure 1:
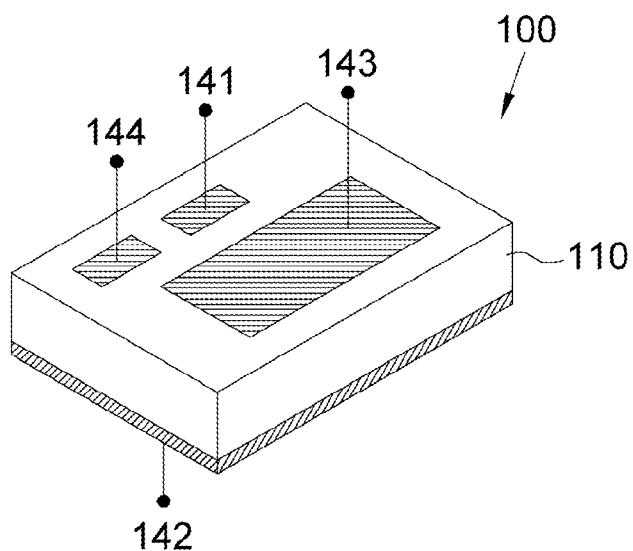
FIG. 1 shows a top view of a semiconductor device according to an embodiment of the present invention.
Figure 2:
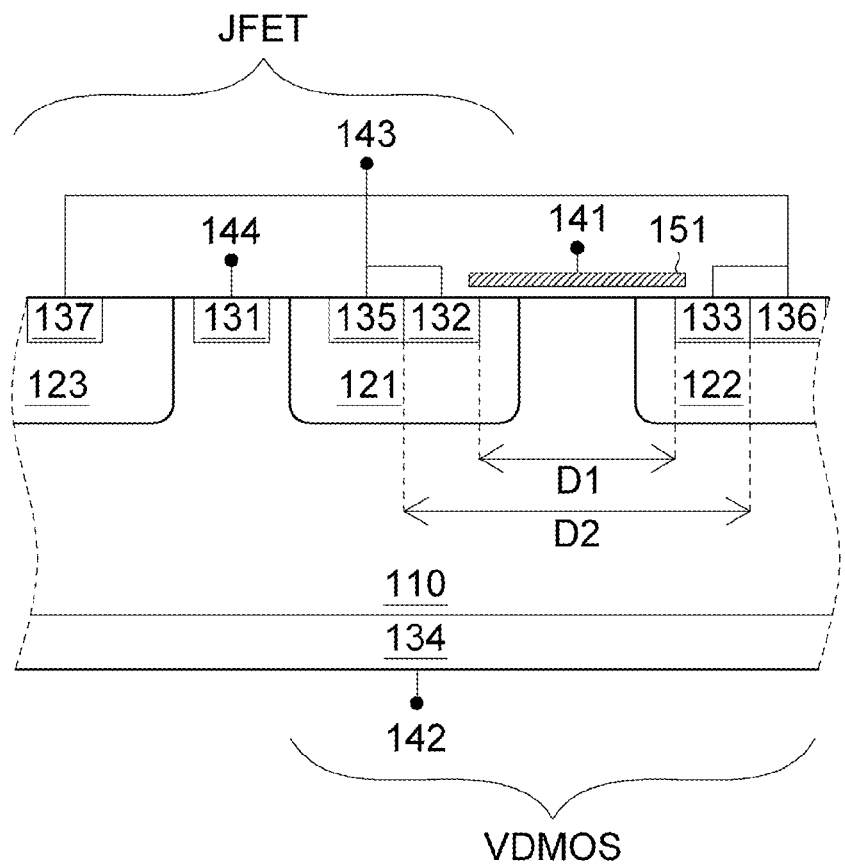
FIG. 2 shows a cross-section view of the semiconductor device of FIG. 1.

Please refer to FIGS. 1-2. FIG. 1 shows a top view of a semiconductor device 100 according to an embodiment of the present invention. FIG. 2 shows a cross-section view of the semiconductor device 100 of FIG. 1. The semiconductor device 100 is formed by integrating a VDMOS and a JFET. The semiconductor device 100 comprises a substrate 110, a first well 121, a second well 122, a third well 123, a first doping region 131, a second doping region 132, a third doping region 133, a fourth doping region 134, a fifth doping region 135, a sixth doping region 136, a seventh doping region 137, a polysilicon layer 151, a first electrode 141, a second electrode 142 and a third electrode 143.

In the present embodiment, the first well 121, the second well 122 and a third well 123 are located at a top side of the substrate 110 and separated from each other. The first well 121 is located between the second well 122 and the third well 123.

The first doping region 131 is formed in the substrate 110 and located between the first well 121 and the third well 123. The first doping region 131 is separated from the first well 121 and the third well 123. The second doping region 132 and the fifth doping region 135 are formed in the first well 121 and connected with each other. The third doping region 133 and the sixth doping region 136 are formed in the second well 122 and connected with each other. The fourth doping region 134 is formed in the substrate 110. The seventh doping region 137 is formed in the third well 123. The seventh doping region 137, the first doping region 131, the fifth doping region 135, the second doping region 132, the third doping region 133 and the sixth doping region 136 are located at the top side of the substrate 110. The fourth doping region 134 is located at the bottom side of the substrate 110. The polysilicon layer 151 is formed above the substrate 110 and located above a gap between the second doping region 132 and the third doping region 133.

Base on the need of the product, the fifth doping region 135, the sixth doping region 136 and the seventh doping region 137 can be omitted in some embodiments. This is not for limiting the scope of protection of the invention.

The first electrode 141 is connected to the polysilicon layer 151. The second electrode 142 is electrically connected to the fourth doping region 134. The third electrode 143 is electrically connected to the second doping region 132, the third doping region 133, the fifth doping region 135, the sixth doping region 136 and the seventh doping region 137. The fourth electrode 144 is electrically connected to the first doping region 131.

The distance D1 between the second doping region 132 and the third doping region 133 is less than the distance D2 of the fifth doping region 135 and the sixth doping region 136. That is to say, the second doping region 132 and the third doping region 133 are close to the first electrode 141, and the fifth doping region 135 and the sixth doping region 136 are far from the first electrode 141.

The doping type of the substrate 110, the first doping region 131, the second doping region 132, the third doping region 133 and the fourth doping 134 are the same and complementary to that of the first well 121, the second well 122, the third well 123, the fifth doping region 135, the sixth doping region 136 and the seventh doping region 137.

In the embodiment, each doping type of the substrate 110, the first doping region 131, the second doping region 132, the third doping region 133, and the fourth doping region 134 is N type, and each doping type of the first well 121, the second well 122, the third well 123, the fifth doping region 135, the sixth doping region 136 and the seventh doping region 137 is P type.

In other embodiment, each doping type of the substrate 110, the first doping region 131, the second doping region 132, the third doping region 133, and the fourth doping region 134 can be P type, and each doping type of the first well 121, the second well 122, the third well 123, the fifth doping region 135, the sixth doping region 136 and the seventh doping region 137 can be N type.

In one aspect, the substrate 110, the first well 121, the second well 122, the second doping region 132, the third doping region 133, the fifth doping region 135, the sixth doping region 136, the first electrode 141, the second electrode 142 and the third electrode 143 form the VDMOS.

In another aspect, the substrate 110, the first well 121, the third well 123, the first doping region 131, the fourth doping region 134, the fifth doping region 135, the seventh doping region 137, the second electrode 142, the third electrode 143 and the fourth electrode 144 form the JFET.

Some of the above mentioned elements are commonly used in the VDMOS and the JFET. For example, the first well 121, the fourth doping region 134, the fifth doping region 135, the second electrode 142 and the third electrode 143 are commonly used in the VDMOS and JFET. The VDMOS and the JFET are not only connected with each other, but also integrated into a unitary structure. Therefore, the size of the semiconductor device 100 having the functions of VDMOS and the JFET can be reduced.

Figure 3:
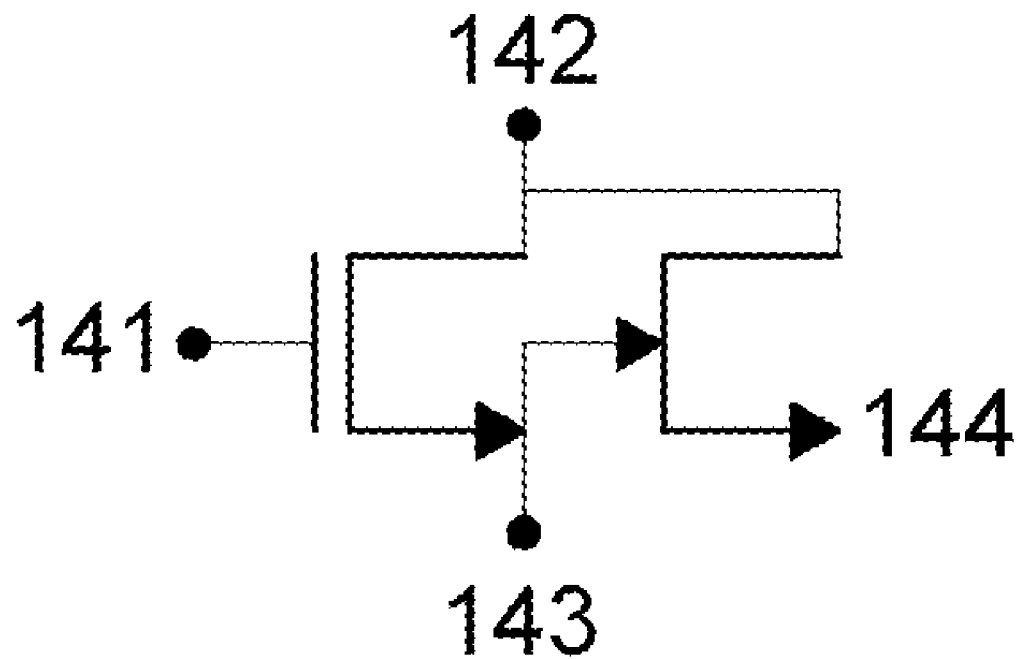
FIG. 3 shows a circuit diagram of the semiconductor device of FIG. 1.

Please refer to FIGS. 2-3. FIG. 3 shows a circuit diagram of the semiconductor device 100 of FIG. 1. The first electrode 141 is functioned as a first gate electrode of the VDMOS. The second electrode 142 can be functioned as a first drain electrode of the VDMOS and a second drain electrode of the JFET at the same time. The third electrode 143 can be functioned as a first source electrode of the VDMOS and a second gate electrode of the JFET. The fourth electrode 144 is functioned as a second source electrode of the JFET.

When a driving voltage is applied on the second electrode 142 of the VDMOS, a current is directly flowed through JFET until the JFET is pinched off. The JFET can be used as an electronically-controlled switch or as a voltage-controlled resistance. Current flows through a semiconductor channel between the second electrode 142 and the fourth electrode 144. By applying a bias voltage to the third electrode 143, the channel is pinched, so that the current is saturated. If the current is transmitted to the first electrode 141, then the VDMOS can be self drove without any secondary driving voltage.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a substrate;
   a first well, a second well and a third well, located at a top side of the substrate and separated from each other, the first well located between the second well and the third well;
   a first doping region, a second doping region, a third doping region and a fourth doping region, the first doping region formed in the substrate and located between the first well and the third well, the second doping region formed in the first well, the third doping region formed in the second well, the fourth doping region formed in the substrate and located at a bottom side of the substrate;
   a polysilicon layer, formed above the substrate and located above a gap between the second doping region and the third doping region; and
   a first electrode, a second electrode, a third electrode and a fourth electrode, the first electrode electrically connected to the polysilicon layer, the second electrode electrically connected to the fourth doping region, the third electrode electrically connected to the third well, the second doping region and the third doping region, and the fourth electrode electrically connected to the first doping region;
   wherein, the doping type of the substrate, the first doping region, the second doping region, the third doping region, and the fourth doping are the same and complementary to that of the first well, the second well and the third well.

2. The semiconductor device according to claim 1, further comprising
   a fifth doping region, a sixth doping region and a seventh doping region, the fifth doping region formed in the first well, the sixth doping region formed in the second well, and the seventh doping region formed in the third well.

3. The semiconductor device according to claim 2, wherein the fifth doping region is connected to the second doping region, and the sixth doping region is connected to the third doping region.

4. The semiconductor device according to claim 2, wherein the doping type of the fifth doping region, the sixth doping region and the seventh doping region are the same and complementary to that of the first doping region, the second doping region, the third doping region and the fourth doping region.

5. The semiconductor device according to claim 2, wherein the distance between the second doping region and the third doping region is less than that of the fifth doping region and the sixth doping region.

6. The semiconductor device according to claim 2, wherein the third electrode is also electrically connected to the fifth doping region, the sixth doping region and the seventh doping region.

7. The semiconductor device according to claim 1, wherein the first doping region is separated from the first well and the third well.

8. The semiconductor device according to claim 1, wherein each doping type of the substrate, the first doping region, the second doping region, the third doping region, and the fourth doping region is N type, and each doping type of the first well, the second well and the third well is P type.

9. The semiconductor device according to claim 1, wherein each doping type of the substrate, the first doping region, the second doping region, the third doping region, and the fourth doping is region P type, and each doping type of the first well, the second well and the third well is N type.

10. A semiconductor device, comprising:
   a substrate;
   a VDMOS, formed in the substrate;
   a JFET, formed in the substrate; and
   a first electrode, a second electrode, a third electrode and a fourth electrode;
   wherein, the first electrode, the second electrode and the third electrode are connected to the VDMOS and used as a first gate electrode, a first drain electrode and a first source electrode of the VDMOS respectively; and
   the second electrode, the third electrode and the fourth electrode are connected to the JFET and used as a second drain electrode, a second gate electrode and a second source electrode of the JFET respectively.

11. The semiconductor device according to claim 10, wherein the VDMOS comprises:
   the substrate;
   a first well and a second well, located at a top side of the substrate and separated from each other;
   a second doping region and a third doping region, the second doping region formed in the first well, the third doping region formed in the second well; and
   the first electrode, the second electrode and the third electrode.

12. The semiconductor device according to claim 11, wherein the VDMOS further comprises:
   a fifth doping region and a sixth doping region, the fifth doping region formed in the first well, the sixth doping region formed in the second well.

13. The semiconductor device according to claim 12, wherein the JFET comprises:
   the substrate;
   the first well and a third well, located at the top side of the substrate and separated from each other, the first well located between the second well and the third well;
   a first doping region and a fourth doping region, the first doping region formed in the substrate and located between the first well and the third well, the fourth doping region formed in the substrate and located at a bottom side of the substrate; and
   the third electrode and the fourth electrode.

14. The semiconductor device according to claim 13, wherein the JFET further comprises:
   the fifth doping region and a seventh doping region, the fifth doping region formed in the first well, the seventh doping region formed in the third well.

* * * * *